United States Patent [19]

Yamazaki et al.

[11] Patent Number: 4,581,620

[45] Date of Patent: Apr. 8, 1986

[54] SEMICONDUCTOR DEVICE OF NON-SINGLE CRYSTAL STRUCTURE

[75] Inventors: Shunpei Yamazaki, 21-21 Kitakarasuyama 7-chome, Setagaya-ku, Tokyo, Japan; Yujiro Nagata, Ichikawa, both of Japan

[73] Assignee: Shunpei Yamazaki, Tokyo, Japan

[21] Appl. No.: 278,418

[22] Filed: Jun. 29, 1981

[30] Foreign Application Priority Data

Jun. 30, 1980 [JP] Japan .................................. 55-88974

[51] Int. Cl.[4] .......................................... H01L 29/04
[52] U.S. Cl. .......................................... 357/2; 357/16; 357/20; 357/30; 357/58; 357/91; 357/59
[58] Field of Search .................. 357/2, 30 J, 30 K, 30, 357/58, 16, 91, 20, 59

[56] References Cited

U.S. PATENT DOCUMENTS

| | | | |
|---|---|---|---|
| 3,716,844 | 2/1973 | Brodsky | 357/2 |
| 3,771,026 | 11/1973 | Asai et al. | 357/59 |
| 4,062,034 | 12/1977 | Matsushita et al. | 357/63 |
| 4,113,531 | 9/1978 | Zanio et al. | 357/59 |
| 4,224,084 | 9/1980 | Pankove | 357/2 |
| 4,239,554 | 12/1980 | Yamazaki | 357/2 |
| 4,240,843 | 12/1980 | Cellar et al. | 357/20 |
| 4,267,011 | 5/1981 | Shibata et al. | 357/59 |
| 4,270,018 | 5/1981 | Gibbons | 357/2 |
| 4,272,880 | 6/1981 | Pashley | 357/59 |
| 4,339,285 | 7/1982 | Pankove | 357/91 |

*Primary Examiner*—Martin H. Edlow
*Assistant Examiner*—Jerome Jackson
*Attorney, Agent, or Firm*—Murray, Whisenhunt and Ferguson

[57] ABSTRACT

A semiconductor device which has a non-single crystal semiconductor layer formed on a substrate and in which the non-single crystal semiconductor layer is composed of a first semiconductor region formed primarily of non-single crystal semiconductor and a second semiconductor region formed primarily of semi-amorphous semiconductor. The second semi-conductor region has a higher degree of conductivity than the first semiconductor region so that a semi-conductor element may be formed.

13 Claims, 27 Drawing Figures

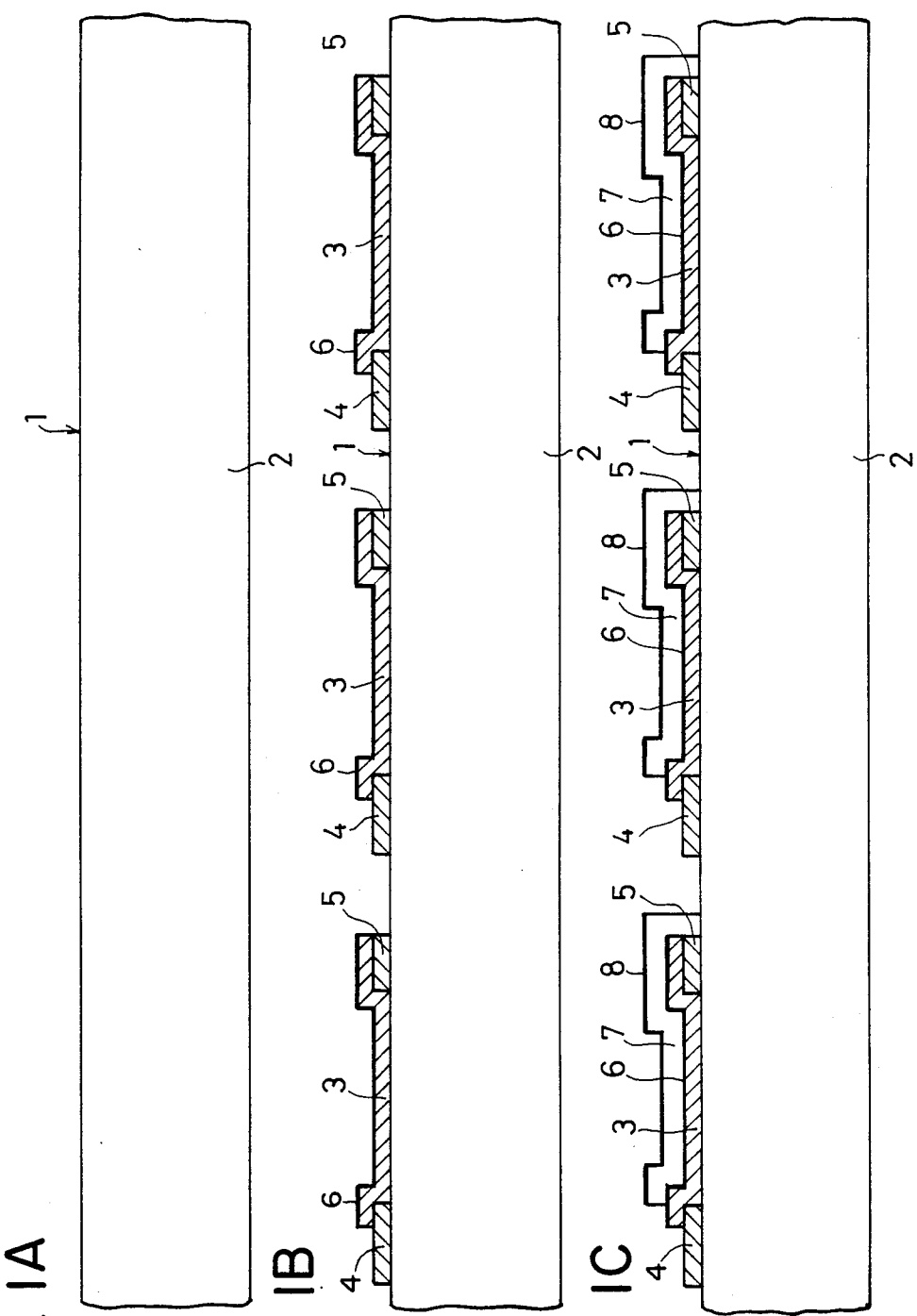

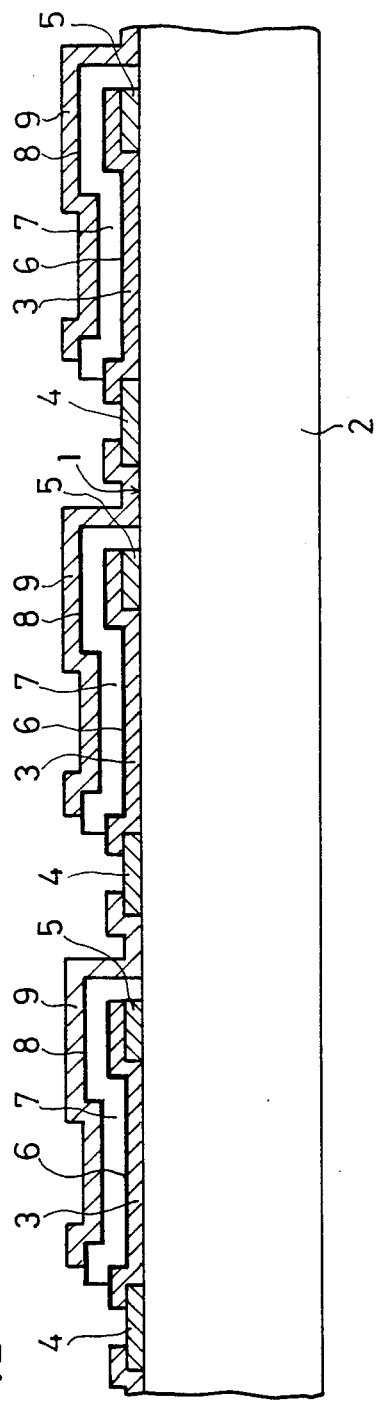
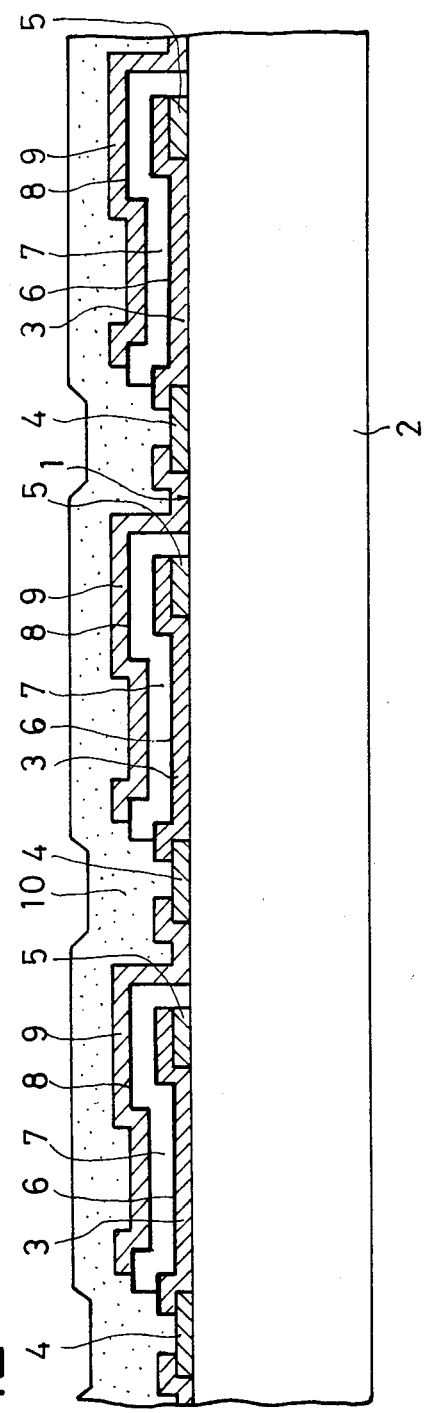

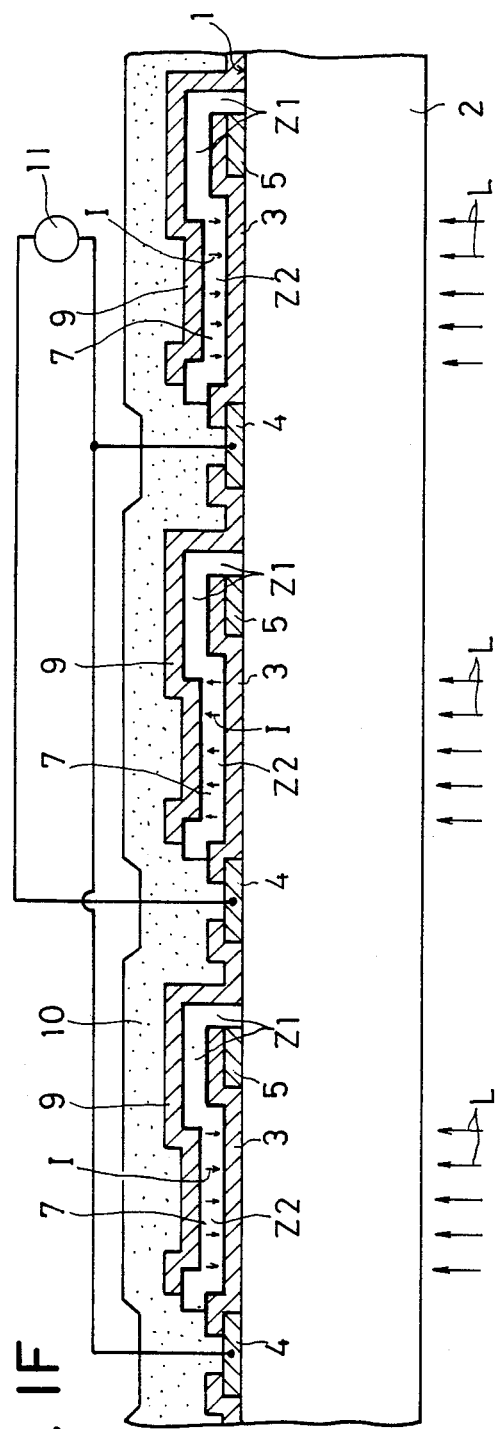
Fig. IF
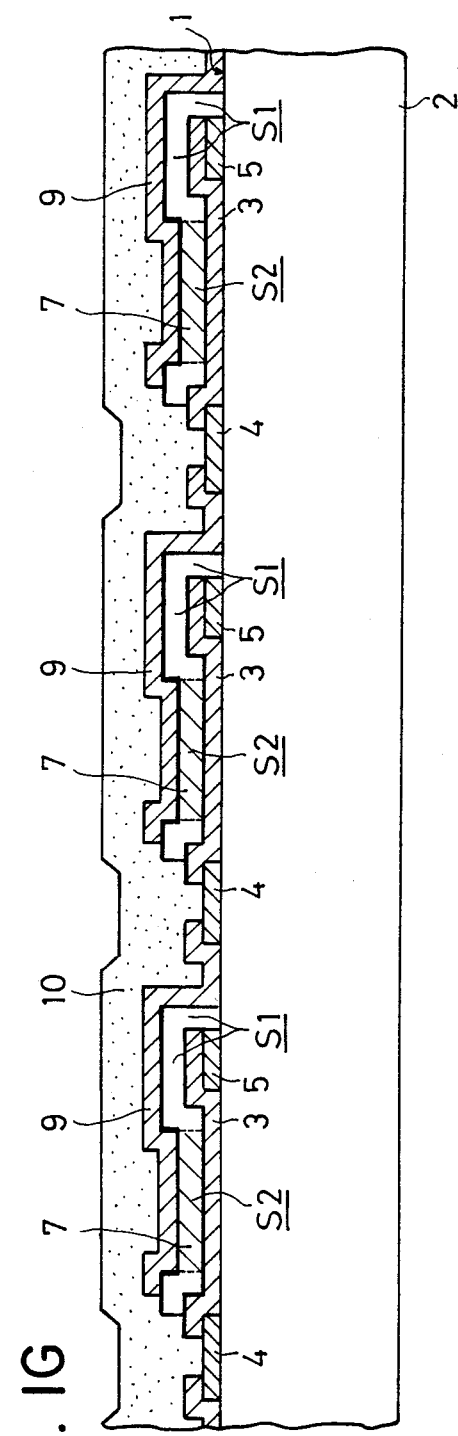
Fig. IG

Fig. 6F
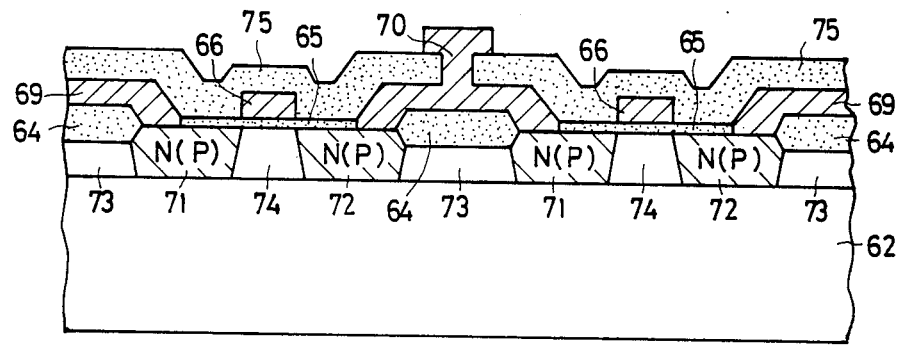
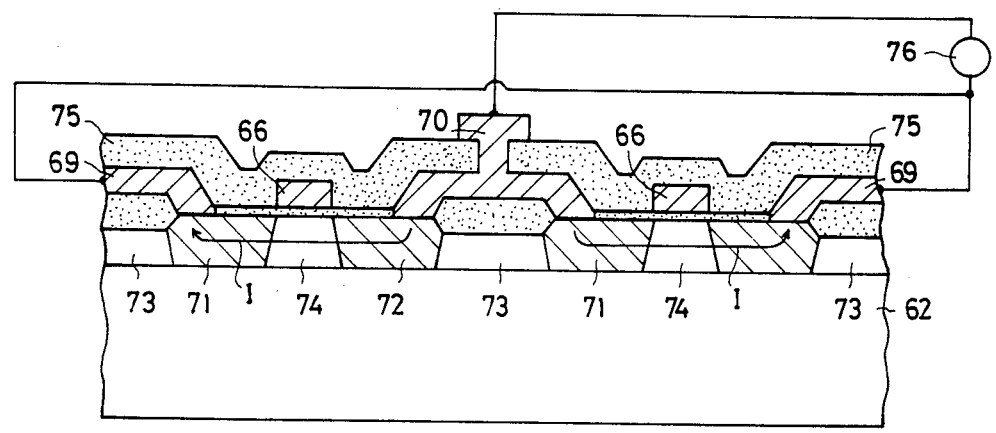
Fig. 6G

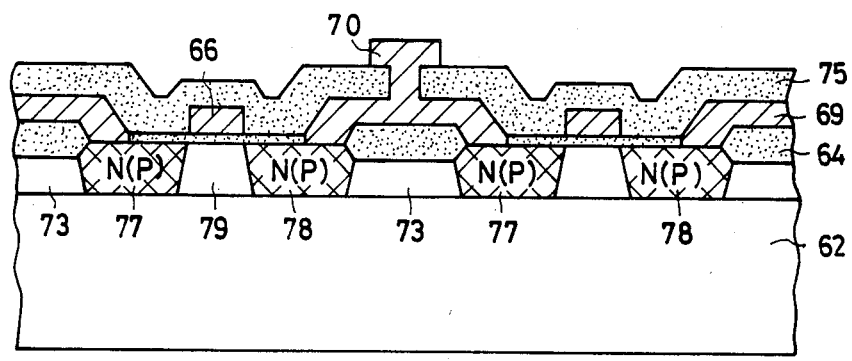
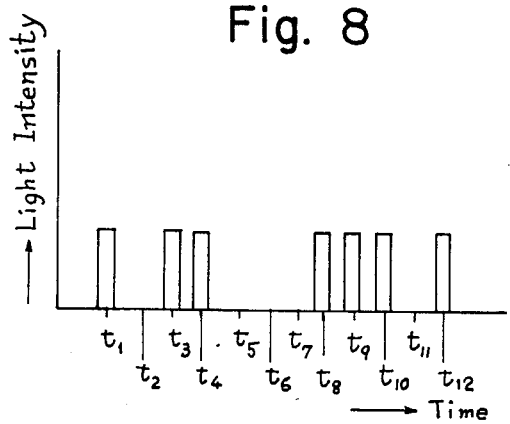
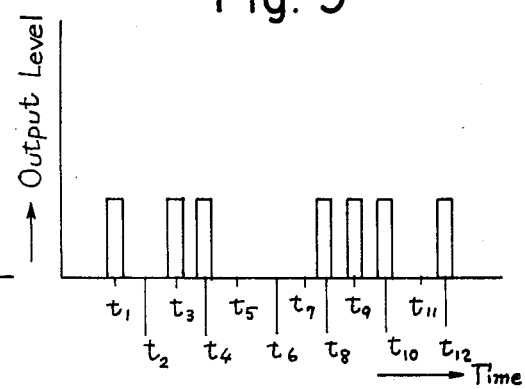

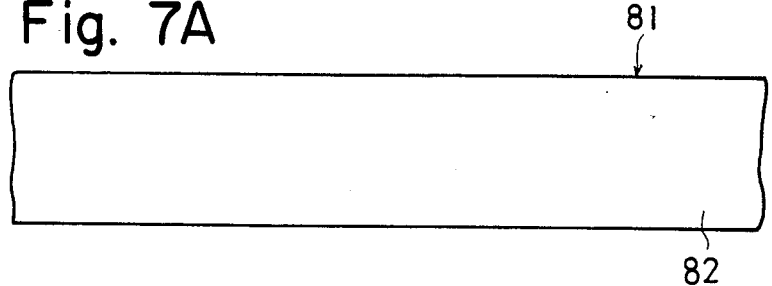
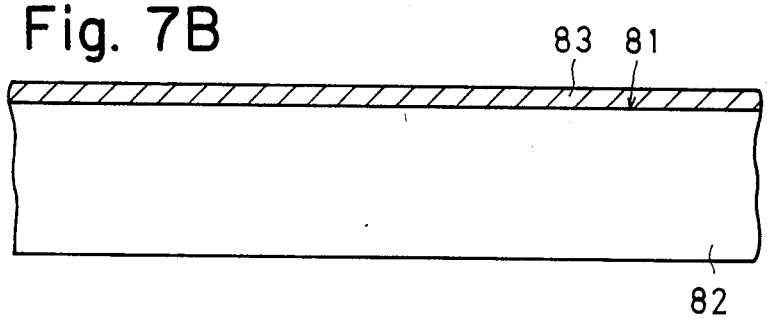
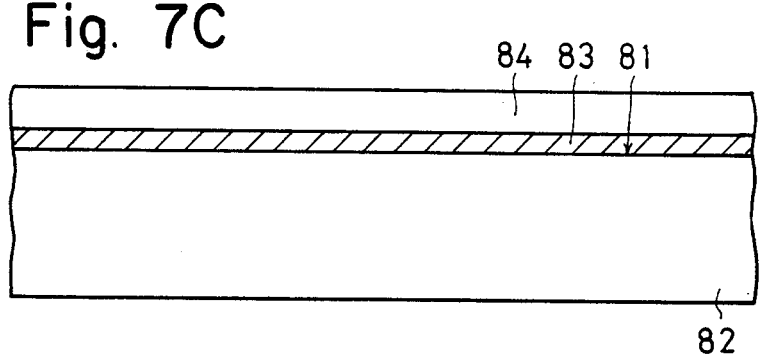

SEMICONDUCTOR DEVICE OF NON-SINGLE CRYSTAL STRUCTURE

BACKGROUND OF THE INVENTION

1. Field of the Invention

The present invention relates to a semicondcutor device formed using non-single crystal semiconductor.

2. Description of the Prior Art

Heretofore, there has been proposed a semiconductor device formed using semi-amorphous semiconductor.

The semi-amorphous semiconductor herein mentioned is defined as a semiconductor which is formed of a mixture of a microcrystalline semiconductor and a non-crystalline semiconductor and in which the mixture doped with a dangling bond neutralizer and the microcrystalline semiconductor has a lattice strain.

In the semiconductor device using the semi-amorphous semiconductor, the semi-amorphous semiconductor formed in the shape of a layer provides a large optical absorption coefficient as compared with a single crystal semiconductor. Accordingly, with a semi-amorphous semiconductor layer of sufficiently smaller thickness than the layer-shaped single crystal semiconductor of the semiconductor device using the single crystal semiconductor, it is possible to achieve a higher photoelectric conversion efficiency than that obtainable with the single crystal semiconductor device.

Further, in the semi-amorphous semiconductor device, the semi-amorphous semiconductor provides a high degree of photoconductivity, a high degree of dark-conductivity, a high impurity ionization rate and a large diffusion length of minority carriers as compared with an amorpous or polycrystalline semiconductor. This means that the semi-amorphous semiconductor device achieves a higher degree of photoelectric conversion efficiency than an amorphous or polycrystalline semiconductor device.

Accordingly, the semi-amorphous semiconductor device is preferable as a semiconductor photoelectric conversion device.

In the conventional semi-amorphous semiconductor device, however, the number of recombination centers contained in the semi-amorphous semiconductor is as large as about $10^{17}$ to $10^{19}/cm^3$. Owing to such a large number of recombination centers, the diffusion length of the minority carriers in the semi-amorphous semiconductor is not set to a desirable value of about 1 to 50 $\mu m$ which is intermediate between 300Å which is the diffusion length of the minority carriers in an amorphous semiconductor and $10^3$ $\mu m$ which is the diffusion length of the minority carriers in a single crystal semiconductor. Therefore, according to the conventional semiconductor technology, the semi-amorphous semiconductor device has a photoelectric conversion efficiency as low as only about 2 to 4%.

Further, there has been proposed, as the semiconductor device using the semi-amorphous semiconductor, a semiconductor device which has a plurality of electrically isolated semicondcutor elements.

In such a prior art semiconductor device, however, the structure for isolating the plurality of semiconductor elements inevitably occupies an appreciably large area relative to the overall area of the device. Therefore, this semiconductor device is low in integration density. In addition, the structure for isolating the plurality of semiconductor elements is inevitably complex. Therefore, the semiconductor device of this type cannot be obtained with ease and at low cost.

SUMMARY OF THE INVENTION

Accordingly, it is an object of the present invention to provide a novel semiconductor device which possesses a higher degree of photoelectric conversion efficiency than does the conventional semicondcutor device.

Another object of the present invention is to provide a novel semiconductor device in which a plurality of electrically isolated semiconductor elements are formed with higher integration density.

Yet another object of the present invention is to provide a novel semiconductor device which is easy to manufacture at low cost.

Other object, features and advantages of the present invention will become more apparent from the following description taken in conjunction with the accompanying drawings.

BRIEF DESCRIPTION OF THE DRAWINGS

FIGS. 1A to 1G schematically show, in section, a sequence of steps involved in the manufacture of a semiconductor device in accordance with an embodiment of the present invention;

FIGS. 6A to 6H are schematic sectional views showing a sequence of steps involved in the manufacture of a semiconductor in accordance with another embodiment of the present invention;

FIGS. 7A to 7F are schematic sectional views showing a sequence of steps involved in the manufacture of a semiconductor in accordance with another embodiment of the present invention;

FIG. 8 is a timing chart explanatory of a method for the formation of a second semiconductor region in the step of FIG. 7E; and FIG. 9 is a timing chart explanatory of an example of the use of the semiconductor device produced by the manufacturing method depicted in FIGS. 7A to 7F.

DESCRIPTION OF THE PREFERRED EMBODIMENTS

Figure 2:
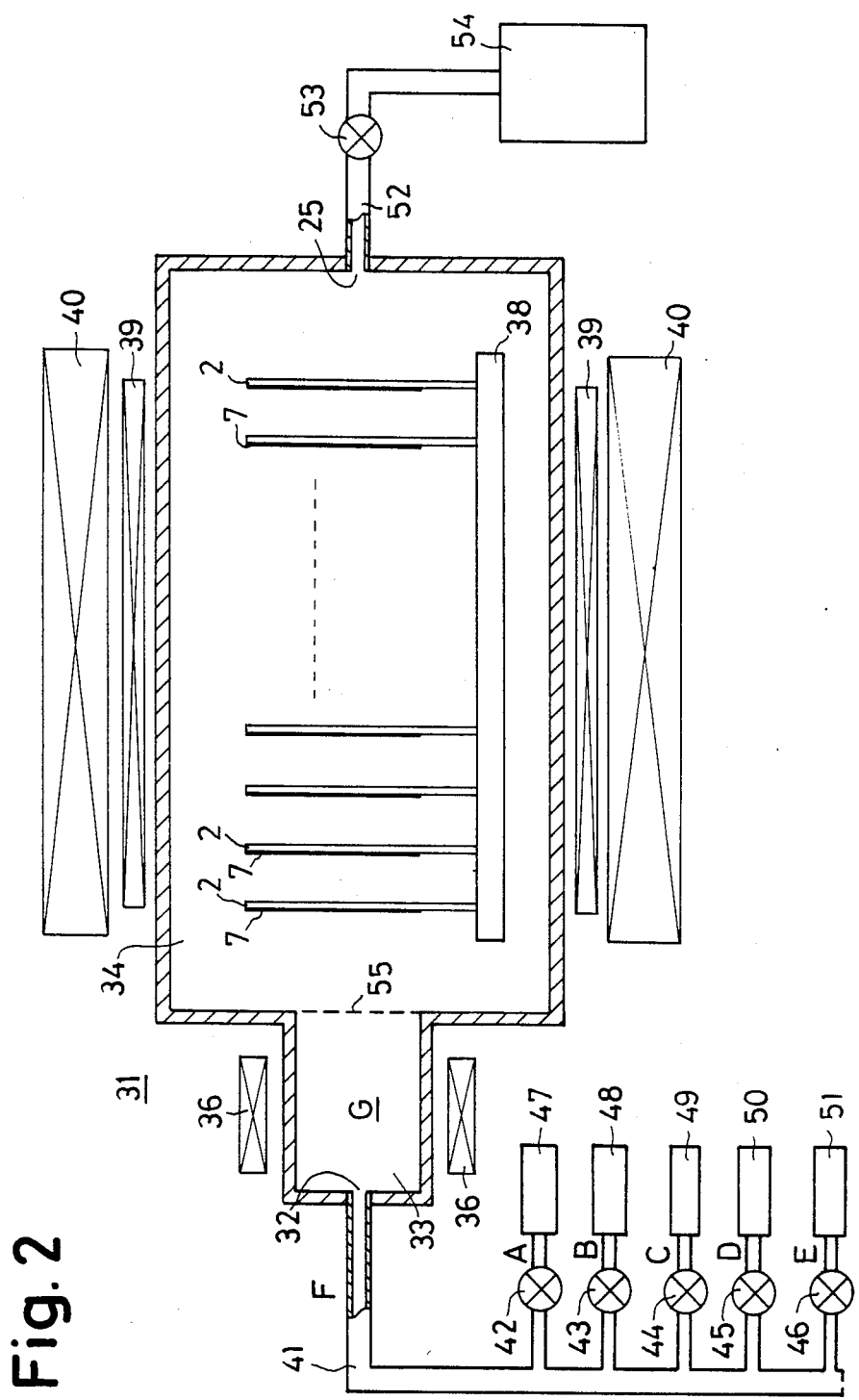
FIG. 2 is a schematic diagram illustrating an arrangement for the formation of a non-single crystal semiconductor in the step of FIG. 1C.

An example of the semiconductor device of the present invention will be described in connection with an example of the manufacturing method thereof.

FIGS. 1A to 1F illustrate a sequence of steps involved in the manufacture of a semiconductor device in accordance with a embodiment of the present invention.

The manufacture starts with the preparation of a substrate 2 having a flat major surface 1, such as shown in FIG. 1A. In this embodiment, the substrate 2 is made of a light-permeable insulator such as glass.

The next step consists in the formation of a plurality of conductive layers 3 on the major surface 1 of the substrate 2 by a known method, as depicted in FIG. 1B. The conductive layers 3 are made of metal in this example and light-permeable and has a desired pattern on the major surface 1 of the substrate 2. In this example each of the conductive layers 3 extends at both ends to conductive layers 4 and 5, respectively, which are formed on the major surface 1 of the substrate 2 in advance.

Next, an insulating layer 6 of silicon nitride, for example, is formed as by the plasma CVD method on the conductive layer 3. The insulating layer 6 has a thickness of, for example, 5 to 50Å, preferably 10 to 25Å, small enough to permit the passage therethrough of a tunnel current, and this layer 6 is light-permeable, too.

Then, a non-single crystal semiconductor 7 doped with a dangling bond neutralizer is formed in layer on the major surface 1 of the substrate 2 to cover each of the conductive layers 3 through the insulating layer 6, as depicted in FIG. 1C. In this example the non-single crystal semiconductor layer extends on the outer side surfaces of the conductive layers 3 and 5. The layer 7 can be formed 0.5 to 5 μm thick.

The non-single crystal semiconductor layer 7 can be formed of non-single crystal silicon, germanium or additional semiconductor material compound expressed by $Si_3N_{4-x}$ ($0<x<4$), $SiO_{2x}$ ($0<x<2$), $SiC_x$ ($0<x<1$) or $Si_xGe_{1-x}$ ($0<x<1$). The dangling bond neutralizer is composed of hydrogen or halogen such as fluoride or chlorine.

The non-single crystal semiconductor 7 means a semi-amorphous semiconductor, an amorphous semiconductor or a mixture thereof and it is desired to be the semi-amorphous semiconductor. The semi-amorphous semiconductor is formed of a mixture of a microcrystalline semiconductor and a non-crystalline semiconductor and the mixture is doped with a dangling bond neutralizer and the microcrystalline semiconductor has a lattice strain. According to an embodiment of the semi-amorphous semiconductor, the microcrystalline semiconductor and the non-crystalline semiconductor are both, for example, silicon; in this case, the mixture is normally silicon and the microcrystalline semiconductor is dispersed in the non-crystalline semiconductor. In the case where the non-single crystal semiconductor 7 is the abovesaid semi-amorphous semiconductor, it can be formed by the method described hereinbelow.

FIG. 2 illustrates an embodiment of the non-single crystalline semiconductor manufacturing method of the present invention and an arrangement therefor, in which a reaction chamber 31 is employed.

The reaction chamber 31 has a gas inlet 32, a gas ionizing region 33, semiconductor depositing region 34, and a gas outlet 25 which are provided in this order. The gas ionizing region 33 has a smaller effective cross-section than the semiconductor depositing region 34. Arranged around the gas ionizing region 33 is an ionizing high-frequency power source 36 which applies to the gas ionizing region 33 an ionizing high-frequency electromagnetic field of, for example, as 1 to 10 GHz, preferably 2.46 GHz. The high-frequency power source 36 may be formed by a coil which is supplied with a high-frequency current.

Disposed around the semiconductor depositing region 34 of the reaction chamber 31 is an orientating-accelerating high-frequency power source 39 which applies to the semiconductor depositing region 34 an orientating-accelerating electric field perpendicularly to the surfaces of the substrates 2. The electric field has a relatively low alternating frequency, for example, 1 to 100 MHz, preferably 13.6 MHz. The high-frequency power source 39 may be formed by a coil which is supplied with a high-frequency current. The high-frequency power source 39 is covered with a heating source 40 which heats the semiconductor depositing region 34 and consequently the substrates 2. The heating source 40 may be a heater which is supplied with a direct current.

To the gas inlet 32 of the reaction chamber 31 is connected one end of a mixture gas supply pipe 41, to which are connected a main semiconductor material compound gas source 47, impurity compound gas sources 48 and 49, an additional semiconductor material compound gas source 50 and a carrier gas source 51 through control valves 42, 43, 44, 45, and 46, respectively.

From the main semiconductor material compound gas source 47 is supplied a main semiconductor material compound gas A such as a main semiconductor material hydride gas, a main semiconductor material halide gas, a main semiconductor material organic compound gas or the like. The main semiconductor material gas A is, for example, a silane ($SiH_4$) gas, a dichlorosilane ($SiH_2Cl_2$) gas, a trichlorosilane ($SiHCl_3$) gas, silicon tetrachloride ($SiCl_4$) gas, a silicon tetrafluoride ($SiF_4$) gas or the like. From the impurity compound gas source 48 is supplied an impurity compound gas B such as hydride, halide or hydroxide gas of a metallic impurity, for example, a trivalent impurity such as Ga or In, or a quadrivalent impurity such as Sn or Sb. From the impurity compound gas source 49 is supplied an impurity compound gas C such as hydride, halide or hydroxide gas of a metallic impurity, for example, a pentavalent impurity such as As or Sb. From the additional semiconductor material compound gas source 50 is supplied an additional semiconductor material compound gas D such as an additional semiconductor material hydroxide or halide gas of nitrogen, germanium, carbon, tin, lead or the like, for example, an $SnCl_2$, $SnCl_4$, $Sn(OH)_2$, $Sn(OH)_4$, $GeCl_4$, $CCl_4$, $NCl_3$, $PbCl_2$, $PbCl_4$, $Pb(OH)_2$, $Pb(OH)_4$ or the like gas. From the carrier gas source 51 is supplied a carrier gas E which is a gas composed of or contains a Helium (He) and/or neon (Ne) gas, for example, a gas composed of the helium gas, a neon gas or a mixer gas of the helium gas or the neon gas and a hydrogen gas.

To the gas outlet 25 of the reaction chamber 31 is connected one end of a gas outlet pipe 52, which is connected at the other end to an exhauster 54 through a control valve 53. The exhaust 54 may be a vacuum pump which evacuate the gas in the reaction chamber 1 through the control valve 53 and the gas outlet tube 52.

It is preferred that a gas homegenizer 55 is provided midway between the gas ionizing region 33 and the semiconductor depositing region 34 in the reaction chamber 31.

In the semiconductor depositing region 34 of the reaction chamber 31 there is placed on a boat 38 as of quartz the substrate 2 which has provided on the major surface thereof the conductive layer 3 and the insulating layer 6 thereon, as described previously in respect of FIG. 1C.

As described above, the substrate 2 is placed in the semiconductor depositing region 34 of the reaction chamber 31 and, in the state in which the gas in the reaction chamber 31 is exhausted by the exhauster 54 through the gas outlet 25, the gas outlet pipe 52 and the control valve 53, a mixture gas F containing at least the main semiconductor material compound gas A available from the main semiconductor material compound gas source 47 via the control valve 42 and the carrier gas E available from the carrier gas source 51 via the control valve 46 is introduced into the gas ionizing region of the reaction chamber 31 via the gas inlet 32. In this case, the mixture gas F may contain the impurity compound gas B available from the impurity compound gas source 48 via the control valve 43 or the impurity compound gas C available from the impurity compound gas source 49 via the control valve 44. Further, the mixture gas F may also contain the additional semiconductor material compound gas available from the additional semiconductor material compound gas source 50 via the control valve 45. The amount of the carrier gas E contained in the mixture gas F may be 5 to 99 flow rate %, in particular, 40 to 90 flow rate % relative to the mixture gas F.

A high-frequency electromagnetic field is applied by the ionizing, high-frequency power source 36 to the mixture gas F introduced into the gas ionizing region 33, by which the mixture gas F is ionized into a plasma, thus forming a mixture gas plasma G in the gas ionizing region 33. In this case, the high-frequency electromagnetic field may be one that has a 10 to 300 W high-frequency energy having a frequency of 1 to 100 GHz, for example, 2.46 GHz.

Since the electromagnetic field employed for ionizing the mixture gas F into the mixture gas plasma G in the gas ionizing region 33 is a micro-wave electromagnetic field and has such a high frequency as mentioned above, the ratio of ionizing the mixture gas F into the mixture gas plasma G is high. The mixture gas plasma G contain at least a carrier gas plasma into which the carrier gas contained in the mixture gas F is ionized and a main semiconductor material compound gas plasma into which the semiconductor compound gas is ionized. Since the carrier gas contained in the mixture gas F is a gas composed of or containing the helium gas and/or the neon gas, it has a high ionizing energy. For example, the helium gas has an ionizing energy of 24.57 eV and the neon gas an ionizing energy of 21.59 eV. In contrast thereto, hydrogen and argon employed as the carrier gas in the conventional method have an ionizing energy of only 10 to 15 eV. Consequently, the carrier gas plasma contained in the mixture gas plasma has a large energy. Therefore, the carrier gas plasma promotes the ionization of the semiconductor material compound gas contained in the mixture gas F. Accordingly, the ratio of ionizing the semiconductor material compound gas contained in the mixture gas into the semiconductor material compound gas plasma is high.

Consequently, the flow rate of the semiconductor material compound gas plasma contained in the mixture gas plasma G formed in the gas ionizing region 33 is high relative to the flow rate of the entire gas in the gas ionizing region 33.

The same is true of the case where the additional semiconductor material compound gas D, the metallic impurity compound gas B or C is contained in the mixture gas F and ionized into its gas plasma.

The mixture gas plasma G thus formed is flowed into the semiconductor depositng region 34 through the gas homogenizer 55 by exhausting the gas in the reaction chamber 31 by means of the exhauster 54 through the gas outlet 25, the gas outlet pipe 52 and the control valve 53.

By flowing the mixture gas plasma G into the semiconductor depositing region 34, semiconductor material is deposited on the substrate 2 placed in the semiconductor depositing region 34. In this case, the flow rate of the mixture gas F introduced into the reaction chamber 31, especially the flow rate of the carrier gas E contained in the mixture gas F is controlled beforehand by the adjustment of the control valve 46 and the flow rate of the gas exhausted from the reaction chamber 31 through the gas outlet 25 is controlled in advance by adjustment of the control valve 53, by which the atmospheric pressure in the reaction chamber 31 is held below 1 atm. Moreover, the substrate 2 is maintained at a relatively low temperature under a temperature at which semiconductor layers deposited on the substrate 2 become crystallized, for example, in the range from the room temperature to 700° C. In the case of maintaining the substrate 2 at room temperature, the heating source 40 need not be used, but in the case of holding the substrate 2 at a temperature higher than the room temperature, the heating source 40 is used to heat the substrate 2. Furthermore, the deposition of the semiconductor material on the substrate 2 is promoted by the orientating-accelerating electric field established by the orientating-accelerating high-frequency source 39 in a direction perpendicular to the surfaces of the substrate 2.

As described above, by depositing the semiconductor material on the substrate 2 in the semiconductor depositing region 34 in the state in which the atmospheric pressure in the reaction chamber 31 is held low and the substrate 2 is held at a relatively low temperature, a desired non-single crystal semiconductor 7 which is formed of a mixture of a microcrystalline semiconductor and a non-crystalline semiconductor and in which the mixture is doped with a dangling bond neutralizer is formed on the substrate 2.

In this case, the mixture gas plasma in the semiconductor depositing region 34 is the mixture plasma having flowed thereinto from the gas ionizing region 33, and hence is substantially homogeneous in the semiconductor depositing region 34. Consequently, the mixture gas plasma is substantially homogeneous over the entire surface of the substrate 2.

Accordingly, it is possible to obtain on the substrate 2 the non-single crystal semiconductor 7 which is homogeneous in the direction of its surface and has substantially no or a negligibly small number of voids.

In addition, since the flow rate of the semiconductor material compound gas plasma contained in the mixture gas plasma G formed in the gas ionizing region 33 is large with respect to the flow rate of the entire gas in the gas ionizing region 33, as mentioned previously, the flow rate of the semiconductor material compound gas plasma contained in the mixture gas on the surface of the substrate 2 in the semiconductor depositing region 34 is also large relative to the flow rate of the entire gas on the surface of the substrate 2. This ensures that the non-single crystal semiconductor 7 deposited on the surface of the substrate 2 has substantially no or a negligibly small number of voids and is homogeneous in the direction of the surface of the substrate 2.

Besides, since the carrier gas plasma contained in the mixture gas plasma formed in the gas ionizing region 33 has a large ionizing energy, as referred to previously, the energy of the carrier gas plasma has a large value when and after the mixture gas plasma flows into the semiconductor depositing region 34, and consequently the energy of the semiconductor material compound gas plasma contained in the mixture plasma on the substrate 2 in the semiconductor depositing region 34 has a large value. Accordingly, the non-single crystal semiconductor 7 can be deposited on the substrate 2 with high density.

Furthermore, the carrier gas plasma contained in the mixture gas plasma is composed of or includes the helium gas plasma and/or the neon gas plasma, and hence has a high thermal conductivity. Incidentally, the helium gas plasma has a thermal conductivity of 0.123 Kcal/mHg° C. and the neon gas plasma 0.0398 Kcal/mHg° C. Accordingly, the carrier gas plasma greatly contributes to the provision of a uniform temperature distribution over the entire surface of the substrate 2. In consequence, the non-single crystal semiconductor 7 deposited on the substrate 2 can be made homogeneous in the direction of its surface.

Moreover, since the carrier gas plasma contained in the mixture gas in the semiconductor depositing region 34 is a gas plasma composed of or containing the helium gas plasma and/or the neon gas plasma, the helium gas plasma is free to move in the non-single crystal semiconductor 7 formed on the substrate 2. This reduces the density of recombination centers which tends to be formed in the non-single crystal semiconductor 7, ensuring to enhance its property.

The above has clarified an example of the method for the formation of the non-single crystal semiconductor 7 in the case where it is the semi-amorphous semiconductor. With the above-described method, the non-single crystal semiconductor 7 can be formed containing a dangling bond neutralizer in an amount of less than 5 mol % relative to the semiconductor 7. Further, the non-single crystal semiconductor 7 can be formed by a microcrystalline semiconductor of a particle size ranging from 5 to 200Å and and equipped with an appropriate lattice strain.

The above has clarified the manufacturing method of the present invention and its advantages in the case where the non-single crystal semiconductor 7 is the semi-amorphous semiconductor. Also in the case where the non-single crystal semiconductor 7 is an amorphous semiconductor or a mixture of the semi-amorphous semiconductor and the amorphous semiconductor, it can be formed by the above-described method, although no description will be repeated.

After the formation of the non-single crystal semiconductor 7 on the substrate 2, the insulating layer 8 as of silicon nitride is formed, for example, by the plasma CVD method on the non-single crystal semiconductor 7, as depicted in FIG. 1A. The insulating layer 8 is thin enough to permit the passage therethrough of a tunnel current and light-permeable, as is the case with the insulating layer 6.

Following this, a conductive layer 9 is formed by a known method on the non-single crystal semiconductor 7 in an opposing relation to the conductive layer 3 through the insulating layer 8 as depicted in FIG. 1D. The conductive layer 9 can be provided in the form of a film of alminum, magnesium or the like. In this example, each conductive layer 9 extends across the side of the non-single crystal semiconductor layer 7 and the surface 1 of the substrate 2 to the conductive layer 5 contiguous to the adjoining conductive layer 9.

Thereafter, a protective layer 10 as of epoxy resin is formed on the surface 1 of the substrate 2 to extend over the conductive layers 3, 4, 5 and 9, the insulating layers 6 and 8 and the non-single crystal semiconductor layer 7, as shown in FIG. 1E.

Then, a power source 11 is connected at one end with alternate ones of the conductive layers 4 and at the other end with intermediate ones of them; accordingly, the power source 11 is connected across the conductive layers 3 and 9. At this time, the region Z2 of the non-single crystal semiconductor layer 7, except the outer peripheral region Z1 thereof, is exposed to high L from the side of the light-permeable substrate 2 through the light-permeable conductive layer 3 and insulating layer 6 by the application of light L, electron-hole pairs are created in the non-single crystal semiconductor 7 to increase its conductivity. Accordingly, the irradiation by light L during the application of the current I to the non-single crystal semicondcutor 7 facilitates a sufficient supply of the current I to the region Z2 even if the non-single crystal semicondcutor 7 has a low degree of conductivity or conductivity close to intrinsic conductivity. For the irradiation of the non-single crystal semiconductor 7, a xenon lamp, fluorescent lamp and sunlight, can be employed. According to an experiment, good results were obtained by the employment of a $10^3$-lux xenon lamp. In the region Z2 a semi-amorphous semiconductor S2 is formed, as depicted in FIG. 1G. The mechanism by which the semi-amorphous semiconductor S2 is formed in the region Z2 is that heat is generated by the current I in the region Z2, by which it is changed in terms of structure.

In the case where the non-single crystal semiconductor 7 is formed of the semi-amorphous semiconductor (which will hereinafter be referred to as a starting semi-amorphous semiconductor), the region Z2 is transformed by the heat generated by the current I into the semi-amorphous semiconductor S2 which contains the microcrystalline semiconductor more richly than does the starting semi-amorphous semiconductor. Even if the non-single crystal semiconductor 7 is the amorphous semiconductor or the mixture of the semi-amorphous and the amorphous semiconductor, the semi-amorphous semiconductor S2 is formed to have the same construction as in the case where the non-single crystal semiconductor 7 is the semi-amorphous one.

By the thermal energy which is yielded in the region Z2 when the semi-amorphous semiconductor S2 is formed in the region Z2, dangling bonds of the semiconductor are combined, neutralizing the dangling bonds in that region. The non-single crystal semiconductor 7 is doped with a dangling bond neutralizer such as hydrogen and/or halogen. Accordingly, the dangling bond neutralizer is activated by the abovesaid thermal energy in the region Z2 and its vicinity and combined with the dangling bonds of the semiconductor. As a result of this, the semi-amorphous semiconductor S2 formed in the region Z2 has a far smaller number of recombination centers than the non-single crystal semiconductor. According to our experience, the number of recombination centers in the semi-amorphous semiconductor S2 was extremely small—on the order of $1/10^2$ to $1/10^4$ that of the non-single crystal semiconductor 7.

Since the number of recombination centers in the semi-amorphous semiconductor S2 is markedly small as described above, the diffusion length of minority carriers lies in the desirable range of 1 to 50 μm.

The thermal energy which is produced in the region Z2 during the formation therein of the semi-amorphous semiconductor S2 contributes to the reduction of the number of recombination centers and the provision of the suitable diffusion length of minority carriers. Further, it has been found that the generation of the abovesaid heat contributes to the formation of the semi-amorphous semiconductor S2 with an interatomic distance close to that of the single crystal semiconductor although the semiconductor S2 does not have the atomic orientation of the latter. In the case where the non-single crystal semiconductor 7 was non-single crystal silicon, the semi-amorphous semiconductor S2 was formed with an interatomic distance of 2.34Å±20% nearly equal to that 2.34Å of single crystal silicon. Accordingly, the semi-amorphous semiconductor S2 has stable properties as semiconductor, compared with the non-single crystal semiconductor 7.

Figure 3:
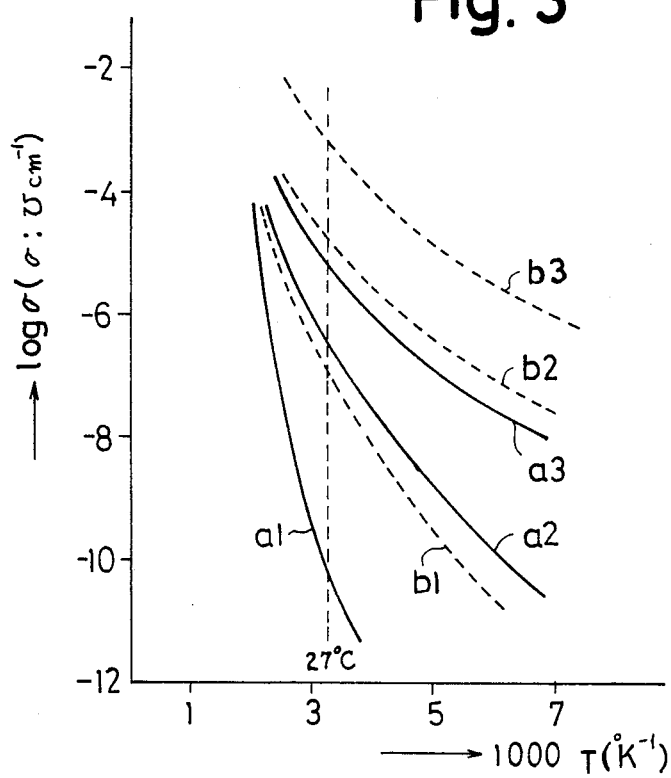
FIG. 3 is a graph showing the temperature vs. dark current characteristic of a second semiconductor region in the semiconductor device of the present invention.

Further, it has been found that the abovementioned heat generation contributes to the formation of the semi-amorphous semiconductor S2 which exhibits an excellent electrical conductivity characteristic. FIG. 3 shows this electrical conductivity characteristic, the abscissa representing temperature $100/T$ (°K$^{-1}$) and the ordinate dark current $\log \sigma$ ($\sigma$:℧cm$^{-1}$). According to our experiments, in which when the non-single crystal semiconductor 7 had a characteristic indicated by the curve a1, the currents having densities of $3 \times 10^1$ and $1 \times 10^3$ A/cm$^2$ were each applied as the aforesaid current I for 0.5 sec. while irradiating by the light L at an illumination of $10^4$ LX, such characteristics as indicated by the curves a2 and a3 were obtained, respectively. In the case where when the non-single crystal semi-conductor 7 had such a characteristic as indicated by the curve b1, the currents of the same values as mentioned above were each applied as the current I for the same period of time under the same illumination condition, a characteristics indicated by the curves b2 and b3 were obtained, respectively. The curve b1 shows the characteristic of a non-single crystal semiconductor obtained by adding 1.2 mol % of the aforementioned metallic impurity, such as Ga or In, Sn or Pb, or As or Sb, to the non-single crystal semiconductor 7 of the characteristic indicated by the curve a1. As is evident from a comparison of the curves a2, a3 and b2, b3, a semi-amorphous semiconductor obtained by adding the abovesaid metallic impurity to the semi-amorphous semiconductor S2 exhibits an excellent conductivity characteristic over the latter with such a metallic impurity added. It is preferred that the amount of metallic impurity added to the semi-amorphous semiconductor S2 be 0.1 to 10 mol %.

Figure 4:
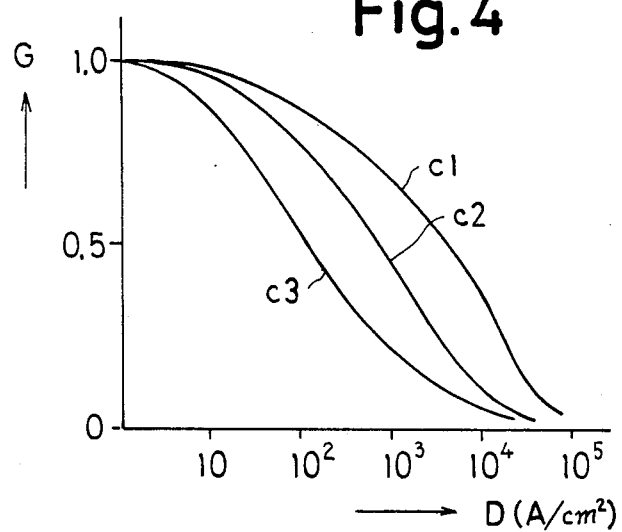
FIG. 4 is a graph showing the spin density of a dangling bond in the second semiconductor region in the semiconductor device of the present invention.

Also it has been found that the aforesaid heat generation greatly contributes to the reduction of dangling bonds in the semi-armophous semiconductor S2. FIG. 4 shows the reduction of the dangling bonds, the abscissa representing the density D (A/cm$^2$) of the current I applied to the region Z2 when forming the semi-amorphous semiconductor S2 and the ordinate representing the normalized spin density G of the dangling bonds. The curves C1, C2 and C3 indicate the reduction of dangling bonds in the cases where the current I was applied to the region Z2 for 0.1, 0.5 and 2.5 sec., respectively. It is assumed that such reduction of the dangling bonds is caused mainly by the combination of semiconductors as the semi-amorphous semiconductor S2 contains as small an amount of hydrogen as 0.1 to 5 mol % although the non-single crystal semiconductor 7 contains as large an amount of hydrogen as 20 mol % or so.

Figure 5:
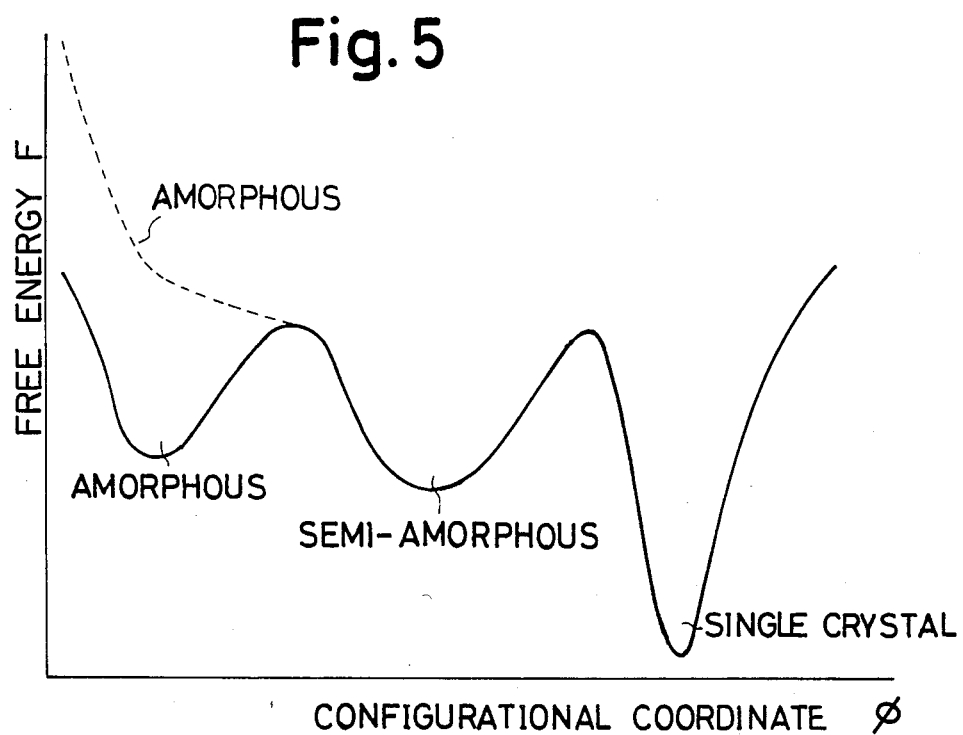
FIG. 5 is a graph showing that the non-single crystal semiconductor obtained by the manufacturing method of FIG. 1 assumes a stable state as is the case with the single crystal semiconductor and the amorphous one.

And the semi-amorphous semiconductor S2 assumes stable states as compared with the single crystal semiconductor and the amorphous semiconductor, as shown in FIG. 5 which shows the relationship between the configurational coordinate $\phi$ on the abscissa and the free energy F on the ordinate.

FIG. 1 illustrates a semiconductor device according to the present invention produced by the manufacturing method described in the foregoing. On the substrate 2 there are provided the semi-amorphous semiconductor region S2 of the abovesaid excellent properties and the non-single crystal semiconductor region S1 formed by that region Z1 of the non-single crystal semiconductor layer 7 in which the current I did not flow during the formation of the semi-amorphous semiconductor region S2. The non-single crystal region S1 does not possess the abovesaid excellent properties of the semi-amorphous semiconductor region S2. Especially, the region S1 does not have the excellent conductivity characteristic of the region S2 and the former can be regarded as an insulating region relative to the latter. Consequently, the non-single crystal semiconductor region S1 electrically isolates the semi-amorphous semiconductor regions S2 from adjacent ones of them. The conductive layer 3, the insulating layer 6 and the semi-amorphous semiconductor region S2 make up one MIS structure, and the conductive layer 9, the insulating layer 8 and the semi-amorphous semiconductor region S2 make up another MIS structure. Such a construction is similar to that of a MIS type photoelectric conversion semiconductor device proposed in the past. Accordingly, by using the conductive layers 3 and 9 as electrodes and applying light to the semiconductor device of FIG. 1F from the outside thereof so that the light may enter the semi-amorphous semiconductor S2 through the light-permeable substrate 2, conductive layer 3 and insulating layer 6, it is possible to obtain the photoelectric conversion function similar to that obtainable with the conventional MIS type photoelectric conversion semiconductor device. In the semi-amorphous semiconductor S2 of the semi-amorphous semiconductor device of FIG. 1F, however, the number of recombination centers is far smaller than in the case of an ordinary semi-amorphous semiconductor (corresponding to the case where the non-single crystal semiconductor 7 prior to the formation of the semi-amorphous semiconductor S2 is semi-amorphous); the diffusion length of minority carriers is in the range of 1 to 50 $\mu$m; and the interatomic distance is close to that in the single crystal semiconductor. Therefore, the semi-conductor device of FIG. 1G has such an excellent feature that it exhibits a markedly high photoelectric conversion efficiency of 8 to 12%, as compared with that of the prior art semiconductor device (corresponding to a device which has the construction of FIG. 1E and has its non-single crystal semiconductor 7 formed of semi-amorphous semiconductor).

Next, a description will be given, with reference to FIGS. 6A to 6H, of a second embodiment of the semiconductor device of the present invention, together with its manufacturing method.

Figure 6A:
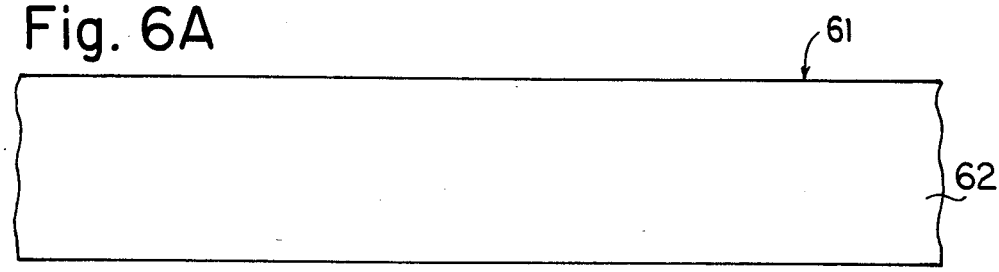

The manufacture starts with the preparation of an insulating substrate 62 with a major surface 61, such as shown in FIG. 6A. The substrate 61 is one that has an amorphous material surface, such as a glass plate, ceramic plate or silicon wafer covered over the entire area of its surface with a silicon oxide film.

Figure 6B:
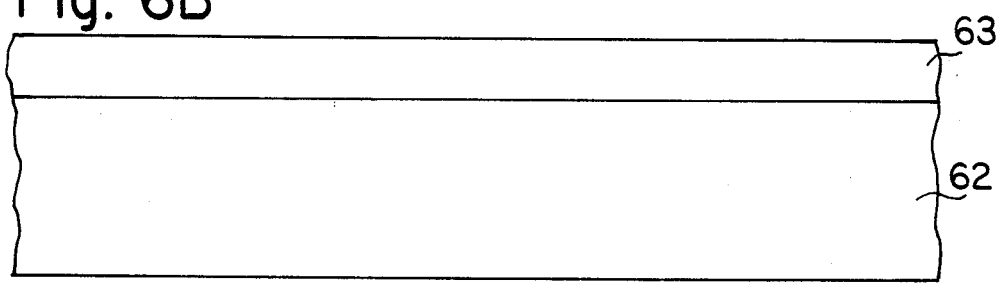

Then as shown in FIG. 6B, a non-single crystal semiconductor layer 63 is formed to a thickness of 0.3 to 1 μm on the substrate 62 by the method described previously in respect of FIG. 2 in the same manner as the non-single crystal semiconductor layer 7 described previously with respect of FIG. 1C.

Figure 6C:
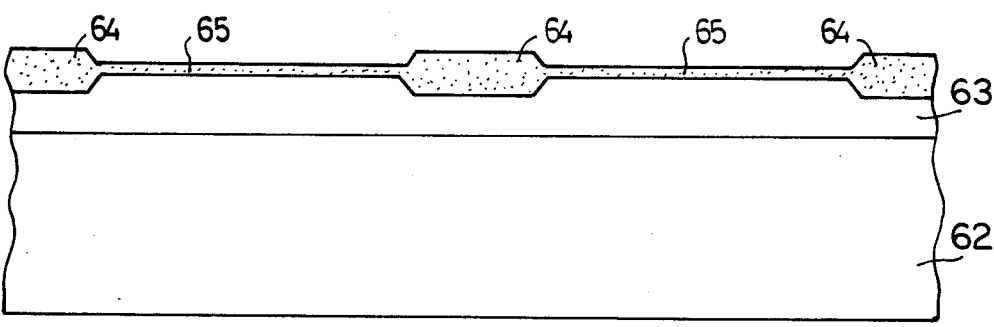

Following this, as shown in FIG. 6C, a ring-shaped insulating layer 64 of semiconductor oxide is formed by known oxidizing method to a relatively large thickness of, for example, 0.2 to 0.5 μm on the side of the surface of the layer 63. Then, an insulating layer 65 of amorphous semiconductor nitirde is formed relatively thin, for example, 50 to 100Å in that region of the layer 63 surrounded by the insulating layer 64.

Figure 6D:
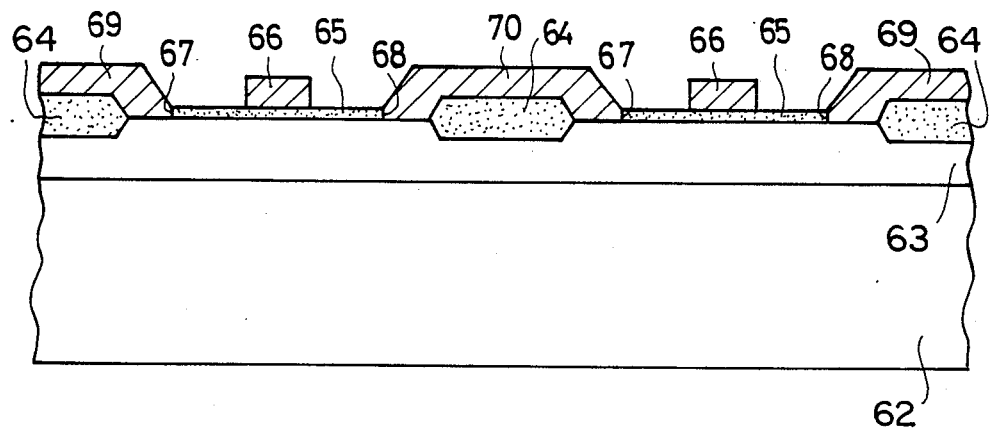

Thereafter, as depicted in FIG. 6D, a conductive layer 66 of amorphous or semi-amorphous semiconductor is formed on the insulating layer 65 to extend across the ring-shaped insulating layer 64 diametrically thereof (in the direction perpendicular to the sheet in the drawing). The semiconductor layer 66 is doped with 0.1 to 5 mol % of an N type conductive material such as Sb or As, or a P type conductive material such as In or Ga. Further, windows 67 and 68 are formed in the insulating layer 65 on both sides of the conductive layer 66 where the windows are contiguous to the insulating layer 64. A conductive layers 69 and 70 similar to the layer 66 extending on the insulating layer 64 are formed to make ohmic contact with the semiconductor layer 63 through the windows 67 and 68, respectively.

Figure 6E:
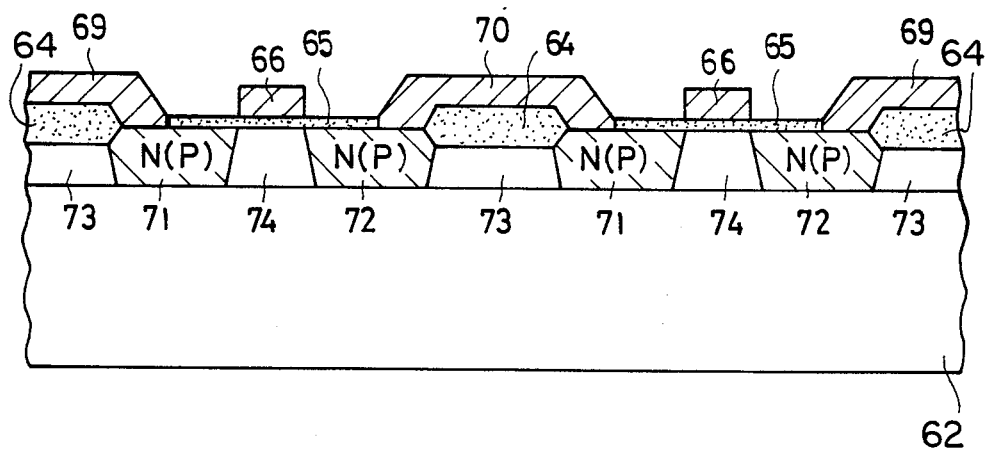

Next, by ion implantation of an impurity into those two regions of the semiconductor layer 63 which are surrounded by the ring-shaped insulating layer 64 and lie on both sides of the conductive layer 66, as viewed from above, impurity injected regions 71 and 72 are formed, as depicted in FIG. 6E. In this case, it must be noted here that the regions 71 and 72 are surrounded by those non-impurity-injected regions 73 and 74 of the layer 63 underlying the insulating layer 64 and the conductive layer 66, respectively.

After this, an inter-layer insulating layer 75 is formed to extend on the insulating layers 64 and 65 and the conductive layers 66, 69 and 70, as illustrated in FIG. 6F.

This is followed by connecting a power source 76 across the conductive layers 69 and 70, by which the current I flows through the regions 71, 72 and 74. In this case, no current flows in the region 73. By the current application, heat is generated in the regions 71, 72 and 74. In consequence, as described previously in respect of FIGS. 1F and 1G, the regions 71, 72 and 74 respectively undergo a structural change into semi-amorphous semiconductor regions 77, 78 and 79, respectively, as shown in FIG. 6H.

In this way, the semiconductor device of the second embodiment of the present invention is obtained.

In the semiconductor device of the present invention shown in FIG. 6H, the regions 77, 78 and 79 correspond to the semi-amorphous semiconductor region S2 in FIG. 1G, providing excellent properties as a semiconductor device. The region 73 corresponds to the non-single crystal semiconductor S1 in FIG. 1G, and hence it has the property of an insulator. The regions 77, 78 and 79 are encompassed by the region 73, so that the regions 77 to 79 are essentially isolated from the other adjoining regions 77 to 79 electrically.

The semiconductor device illustrated in FIG. 6H has a MIS type field effect transition structure which employs the regions 77 and 78 on the insulating substrate 62 as a source and a drain region, respectively, the region 79 as a channel region, the insulating layer 65 as a gate insulating layer, the conductive layer 66 as a gate electrode and the conductive layers 69 and 70 as a source and a drain electrode, respectively. Since the regions 77, 78 and 79 serving as the source, the drain and the channel region have excellent properties as a semiconductor, the mechanism of an excellent MIS type field effect transistor can be obtained. In this example, an excellent transistor mechanism can be obtained even if the conductivity type of the region 79 is selected opposite to those of the regions 77 and 78.

Next, a description will be given, with reference to FIGS. 7A to 7E, of a third embodiment of the present invention in the order of steps involved in its manufacture.

The manufacture begins with the preparation of such an insulating substrate 82 as shown in FIG. 7A which has a flat major surface 81.

The next step consists in the formation of a conductive layer 83 on the substrate 82 as shown in FIG. 7B.

This is followed by forming, as depicted in FIG. 7C, a non-single crystal semiconductor layer 84, for example 0.5 to 1 μm thick on the conductive layer 83 in the same manner as non-single crystal semiconductor 7 in FIG. 1C.

Figure 7D:
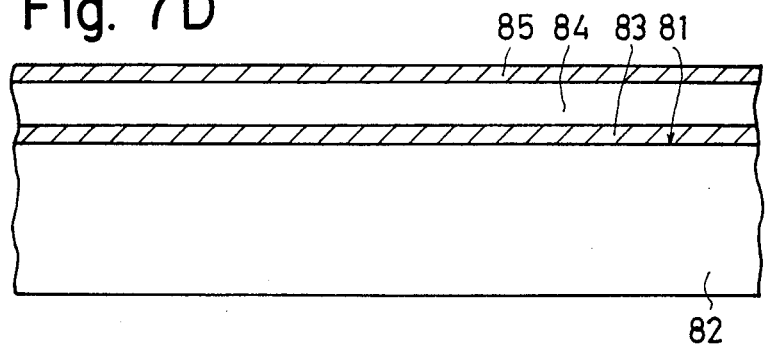

After this, another conductive layer 85 is formed on the non-single crystal layer 84 as depicted in FIG. 7D.

Figure 7E:
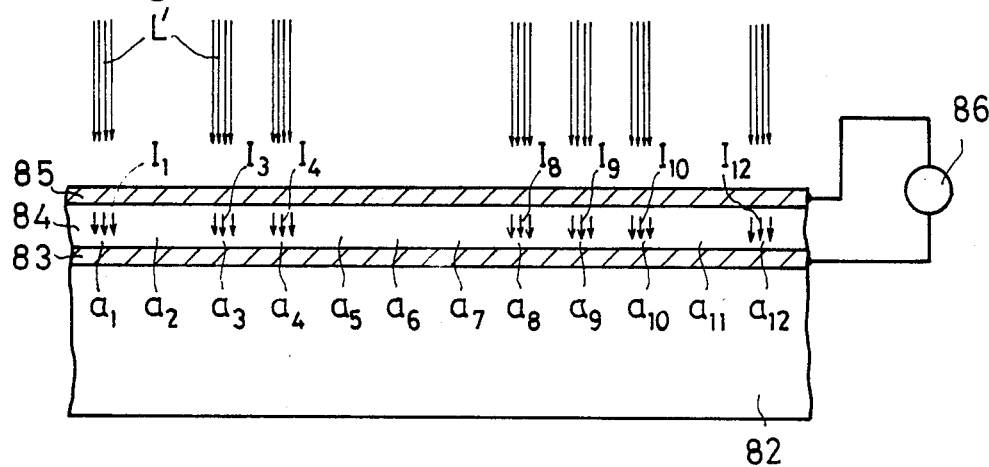

Thereafter, the non-single crystal semiconductor layer 84 is exposed to irradiation by laser light, with a power source 86 connected across the conductive layers 83 and 85, as illustrated in FIG. 7E. In this case a laser beam L' having a diameter of 0.3 to 3 μm, for instance, is applied to the non-single crystal semiconductor layer 84 at selected ones of successive positions $a_1, a_2, \ldots$ thereon, for example, $a_1, a_3, a_4, a_8, a_9$, at the moments $t_1, t_3, t_4, t_8, t_9, \ldots$ in a sequential order, as depicted in FIG. 8. By this irradiation the conductivity of the non-single crystal semiconductor layer 84 is increased at the positions $a_1, a_3, a_4, a_8, a_9, \ldots$ to flow there currents $I_1, I_3, I_4, I_8, I_9, \ldots$, thus generating heat. As a result of this, the non-single crystal semiconductor layer 84 undergoes a structural change at the positions $a_1, a_3, a_4, a_8, a_9, \ldots$ to provide semi-amorphous semiconductor regions $K_1, K_3, K_4, K_8, K_9, \ldots$, as showin in FIG. 7F.

In this way, the semiconductor device of the third embodiment of the present invention is obtained.

Figure 7F:
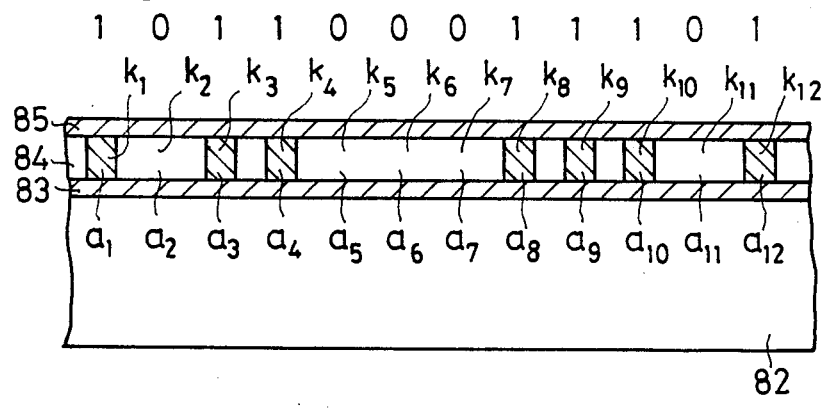

In the semiconductor device of the present invention illustrated in FIG. 7F, the regions $K_1, K_3, K_4, K_8, K_9, \ldots$ correspond to the semi-amorphous semiconductor region S2 in FIG. 1G, providing a high degree of conductivity. Regions $K_2, K_5, K_6, K_7, K_{11}, \ldots$ at the positions $a_2, a_5, a_6, a_7, a_{11}, \ldots$ other than the regions $K_1, K_3, K_4, K_8, K_9, \ldots$ correspond to the non-single crystal semiconductor S1 in FIG. 1G, providing the property of an insulator.

The semiconductor device shown in FIG. 7F can be regarded as a memory in which "1", "0", "1", "1", "0", ... in the binary representation are stored at the positions $a_1, a_2, a_3, a_4, a_5, \ldots$, respectively. When the regions $K_1, K_3, K_4, \ldots$ and consequently the positions $a_1, a_3, a_4, \ldots$ are irradiated by a laser beam of lower intensity than the aforesaid one L' while at the same time connecting the power source across the conductive layers 83 and 85 via a load, the regions $K_1, K_3, K_4, \ldots$ become more conductive to apply a high current to the load. Even if the regions $K_2, K_5, K_6, \ldots$ are irradiated by such low-intensity laser beam, however, no current flows in the load, or if any current flows therein, it is very small. Accordingly, by irradiating the positions $a_1$, $a_2$, $a_3$, . . . by low-intensity light successively at the moments $t_1$, $t_2$, $t_3$, . . . , outputs corresponding to "1", "0", "1", "1", . . . are sequentially obtained in the load, as shown in FIG. 9. In other words, the semiconductor device of this embodiment has the function of a read only memory.

Although in the foregoing embodiments the semiconductor device of the present invention has been described as being applied to a photoelectric conversion element, a MIS type field effect transistor and a photo memory, the embodiments should not be construed as limiting the invention specifically thereto. According to this invention, it is possible to obtain a photoelectric conversion element array composed of a plurality of series-connected photoelectric conversion elements as shown in FIG. 1G. Further, it is possible to form an inverter by a series connection of two MIS type field effect transistors as depicted in FIG. 6H. In this case, those regions of either of MIS type field effect transistors which serve as the source and drain regions thereof differ in conductivity type from those of the other and the region which serves as the channel region is doped, as required, with an impurity that makes it opposite in conductivity type to that of the source and drain regions. Moreover, the semi-amorphous semiconductor forming the semiductor device according to the present invention permits direct transition of electrons even at lower temperatures than does the amorphous semiconductor. Therefore, it is also possible to obtain various semiconductor elements that are preferred to utilize the direct transition of electrons. Also it is possible to obtain various semiconductor elements, including a bipolar transistor and a diode, of course, which have at least one of PI, PIN, PI and NI junctions in the semi-amorphous semiconductor layer forming the semiconductor device according to the present invention.

It will be apparent that many modifications and variations may be effected without departing from the scope of the novel concepts of the present invention.

What is claimed is:

1. A semiconductor device comprising:
a substrate and
a non-single crystal semiconductor layer formed on or over the substrate, the non-single crystal semiconductor layer being composed of a first semiconductor region formed primarily of a first semi-amorphous semiconductor and a second semiconductor region (a) formed primarily of a· second semi-amorphous semiconductor containing microcrystalline semiconductor more than the first semi-amorphous semiconductor and (b) having a higher degree of conductivity than the first semiconductor region;
wherein the first and second semiconductor regions are laterally arranged side by side on or over the substrate.

2. A semiconductor device according to claim 1, which further comprises a first conductive layer extending between the substrate and the second semiconductor region and a second conductive layer extending on or over the second semiconductor region.

3. A semiconductor device according to claim 2 which further comprises a first insulating layer extending between the first conductive layer and the second semiconductor region and a second insulating layer extending between the second semiconductor region and the second conductive layer.

4. A semiconductor device according to claim 1, wherein the second semiconductor region is doped with an impurity which imparts thereto an N or P conductivity type.

5. A semiconductor device according to claim 1 where said non-single crystal semiconductor layer is further composed of a third semiconductor region (a) formed primarily of said second semi-amorphous semiconductor and where the first, second and third semiconductor regions are laterally arranged side by side on or over the substrate so that first semiconductor region is sandwiched between the second and third semiconductor regions.

6. A semiconductor device according to claim 5 wherein the second and third semiconductor regions are doped with an impurity which imparts thereto an N or P conductivity type.

7. A semiconductor device according to claim 6 further comprises an insulating layer extending on the first semiconductor region and a conductive layer extending on the insulating layer.

8. A semiconductor device according to claim 1 where said non-single crystal semiconductor layer is composed of a plurality of said first semiconductor regions where each is formed primarily of said first semi-amorphous semiconductor and a plurality of said second semiconductor regions where each is formed primarily of said second semi-amorphous semiconductor and where the first and second semiconductor regions are laterally arranged side by side on or over the substrate.

9. A semiconductor device according to claim 8 which further comprises a first conductive layer extending between the substrate and the non-single-crystal semiconductor layer.

10. A semiconductor device comprising:
a plurality of photoelectric conversion elements formed on a substrate side by side;
wherein the photoelectric conversion elements each has a first conductive layer as a first electrode formed on the substrate, a non-single-crystal semiconductor layer formed on the first conductive layer, formed of Si, Ge, $Si_3N_{4-x}(0<x<4)$, $SiO_{2x}(0<x<2)$ or $Si_xGe_{1-x}(0<x<1)$, or a material consisting principally thereof and doped with hydrogen or halogen as a dangling bond neutralizer, and a second conductive layer as a second electrode formed on the non-single-crystal semiconductor layer;
wherein the second conductive layer of one of the photoelectric conversion elements is coupled with the first conductive layer of the next photoelectric conversion element;
wherein the non-single-crystal semiconductor layers of the photoelectric conversion elements each has a first semiconductor region and a second semiconductor region having a higher degree of conductivity than the first semiconductor region;
wherein the first and second semiconductor regions are laterally arranged side by side on the first conductive layer; and
wherein the first semiconductor region is formed primarily of a first semiamorphous semiconductor, and wherein the second semiconductor region is formed primarily of a second semiamamorphous semiconductor containing more microcrystalline semiconductor than the first semiamorphous semiconductor.

11. A semiconductor device according to claim 10, which further comprises a first insulating layer extending between the first conductive layer and the second semiconductor region and a second insulating layer extending between the second semiconductor region and the second conductive layer.

12. A semiconductor device according to claim 10, wherein the second semiconductor region is doped with an impurity which imparts thereto an N or P conductive type.

13. A semiconductor device comprising:

a plurality of MIS type transistors formed side by side on a substrate;

wherein the MIS type transistors each has a non-single-crystal semiconductor layer formed on the substrate an insulating layer formed on the non-single-crystal semiconductor layer and a conductive layer formed on the insulating layer;

wherein the non-single crystal semiconductor layer is formed of Si, Ge, $Si_3N_{4-x}(0<x<4)$, $SiO_{2-x}(0<x<2)$, $SiC_x(0<x<1)$ or $Si_xGe_{1-x}(0<x<1)$, or a material consisting principally thereof and doped with hydrogen or halogen as a dangling bond neutralizer;

wherein the non-single-crystal semiconductor has a first semiconductor region as a channel region a second and third semiconductor regions as a source and drain regions respectively connected with the opposing sides of the first semiconductor regions, respectively and having a P or N conductivity type and having a higher degree of conductivity than the first region;

wherein the third, first and second regions are laterally arranged side by side in this order on the substrate;

wherein the insulating layer is disposed on at least the first semiconductor region as a gate insulating layer;

wherein the conductive layer is disposed on at least the first semiconductor region through the insulating layer as a gate electrode; and wherein the first semiconductor region is formed primarily of a first semi-amorphous semiconductor, and wherein the second and third semiconductor regions are formed primarily of a second semi-amorphous semiconductor containing more microcrystalline semiconductor than the first semi-amorphous semiconductor.

* * * * *